(12) United States Patent
Slamowitz et al.

(10) Patent No.: US 6,943,596 B2
(45) Date of Patent: Sep. 13, 2005

(54) POWER-ON RESET CIRCUIT FOR USE IN LOW POWER SUPPLY VOLTAGE APPLICATIONS

(75) Inventors: Mark N. Slamowitz, Chandler, AZ (US); Bassem Radieddine, Pismo Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/095,642

(22) Filed: Mar. 12, 2002

(65) Prior Publication Data

US 2003/0174002 A1 Sep. 18, 2003

(51) Int. Cl.[7] ...................... H03K 17/22; H03K 17/687
(52) U.S. Cl. ................................... 327/143; 327/198
(58) Field of Search ......................... 327/65, 89, 96, 327/142, 143, 198; 323/907

(56) References Cited

U.S. PATENT DOCUMENTS

| | | | |
|---|---|---|---|
| 4,074,150 A | 2/1978 | Buckley, III et al. ......... 327/87 |
| 4,309,627 A * | 1/1982 | Tabata ........................ 327/143 |
| 4,430,582 A | 2/1984 | Bose et al. ................... 326/65 |
| 4,437,024 A | 3/1984 | Wacyk ......................... 326/71 |
| 4,438,352 A | 3/1984 | Mardkha ..................... 326/71 |
| 4,477,736 A | 10/1984 | Onishi ......................... 327/543 |
| 4,563,595 A | 1/1986 | Bose ........................... 327/206 |
| 4,611,126 A * | 9/1986 | Miller ......................... 307/64 |
| 4,677,321 A | 6/1987 | Bacrania ..................... 326/71 |
| 4,937,476 A * | 6/1990 | Bazes .......................... 326/71 |
| 5,278,467 A * | 1/1994 | Nedwek ...................... 327/89 |
| 5,378,936 A * | 1/1995 | Kokubo et al. ............... 327/77 |
| 5,610,542 A * | 3/1997 | Kang et al. .................. 327/143 |
| 6,046,615 A * | 4/2000 | Chevallier et al. .......... 327/143 |
| 6,087,866 A * | 7/2000 | Prucklmayer ............... 327/143 |
| 6,160,429 A * | 12/2000 | Morrill ....................... 327/143 |
| 6,169,424 B1 * | 1/2001 | Kurd ........................... 327/53 |
| 6,181,172 B1 * | 1/2001 | Callahan ..................... 327/143 |
| 6,288,584 B1 * | 9/2001 | Wu et al. .................... 327/143 |
| 6,429,705 B1 * | 8/2002 | Bando et al. ............... 327/143 |
| 6,515,523 B1 * | 2/2003 | Bikulcius .................... 327/142 |

OTHER PUBLICATIONS

Bazes, "Two Novel Fully Complementary Self–Biased CMOS Differential Amplifiers," Feb. 1991, IEEE Journal of Solid–State Circuits, vol. 26, No. 2, pp. 165–168.

* cited by examiner

Primary Examiner—Timothy P. Callahan
Assistant Examiner—Terry L. Englund
(74) Attorney, Agent, or Firm—McAndrews, Held & Malloy

(57) ABSTRACT

Systems and methods are disclosed for a power-on reset used in low power supply voltage applications (i.e., having a full operating power supply voltage of less than about 2.0 volts). One embodiment of the reset circuit comprises a differential voltage generation circuit and an amplifier circuit. The differential voltage generation circuit is adapted to create two voltages changing at different rates. The amplifier circuit is adapted to amplify a difference between the two voltages.

18 Claims, 8 Drawing Sheets

POWER-ON RESET CIRCUIT FOR USE IN LOW POWER SUPPLY VOLTAGE APPLICATIONS

CROSS-REFERENCE TO RELATED APPLICATIONS

[Not Applicable]

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

The present invention relates to a reset circuit. More specifically, the present invention relates to a power-on reset circuit used in low power supply voltage applications.

This invention relates to integrated circuit building blocks more commonly known as Power-On Reset (also known by the three letter acronym "POR") circuits. Such known circuits may be used to reset a part or the entirety of an integrated circuit chip upon the application of a power supply voltage. This is a hardware reset function, working entirely without the need for software control. The mere application of a power supply voltage enables this circuit to set the state of any register to which it is connected.

In prior art POR circuits, the fundamental method used to detect that a minimum voltage level resides at the power supply pins of the integrated circuit or integrated circuit block employs the turn-on point of a PFET transistor (commonly referred to as the "threshold voltage" or "Vt"). However, advancements in integrated circuit technologies, with their physically scaled feature sizes, have forced reductions in the power supply voltage level (i.e., to less than about 2.0 volts) in order to achieve reliable operating lifetimes for the products delivered to the market.

Unfortunately, the Vt of such known fabrication processes has not been directly scaled with the power supply reduction associated with each new generation of silicon technology. As a result, the known circuit techniques employed when power supplies were greater (ranging from about 3 to about 5 volts) are no longer able to adequately provide the level of control necessary for the currently available power supply levels.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in a POR circuit that does not specifically depend on the physical parameters of a transistor (i.e., the Vt of the transistor for example). Rather, one embodiment of the present invention uses circuit techniques to improve the operating range, accuracy and robustness of the POR function that operates at relatively low power supply voltages (less than about 2.0 volts). While one or more embodiments of the present invention operate at relatively low power supplies voltages, it is contemplated that the present invention will work with higher power supply voltages (greater than about 2.0 volts, about 3 to 5 volts for example).

One embodiment of the present invention relates to a power-on reset or POR circuit used in low power supply voltage applications (about 3.3, 2.5, 1.8, 1.2 or less volts for example). This embodiment of the POR circuit comprises a differential voltage generation circuit and an amplifier circuit. The differential voltage generation circuit is adapted to create two voltages changing at different rates. The amplifier circuit is adapted to amplify a difference between two voltages, which ultimately instructs a register to hold a predetermined state. This embodiment may comprise a varied rate voltage pair circuit or resistor divider circuit.

In one embodiment of the present invention, the resistor divider circuit comprises at least one transistor (a PMOS device for example) and two series resistors, where the two series resistors may have different resistance values for example. It is further contemplated that the amplifier circuit is a self-referenced amplifier, comprising at least one PMOS device and at least one NMOS device.

Features of the present invention comprise a switch (two PMOS devices for example) adapted to power down the reset circuit for testing purposes. Yet another feature of the present invention comprises at least two transistors (NMOS devices for example) used with a secondary or different power supply.

One feature of the POR circuit comprises a hysteresis capability (a PMOS device for example) adapted to prevent false re-triggering of the reset circuit. Other features may include a second amplifier circuit (a Schmit Trigger for example) coupled to at least the first amplifier circuit to sharpen up the amplifier output voltage characteristics.

Another embodiment of the present invention relates to a power-on reset or POR circuit adapted to be used with a power supply (having a full operating power supply voltage of less than about 2.0 volts for example). In this embodiment, the POR circuit comprises a resistor divider circuit and an amplifier. The resistor divider circuit is adapted to create two voltages that increase at different rates with an increasing power supply voltage, thereby ultimately instructing a register to hold a predetermined state. The amplifier is adapted to amplify a difference between two voltages when the amplifier has sufficient gain.

Yet another embodiment of the present invention relates to an integrated circuit having at least one power supply (with a full operating power supply voltage of less than about 2.0 volts for example) coupled thereto. This embodiment of integrated circuit comprises a front end portion and a final drive stage. In this embodiment, the front end portion comprises a resistor divider circuit adapted to create two voltages that increase at different rates with an increasing power supply voltage and an amplifier adapted to amplify a difference between two voltages when the amplifier has sufficient gain to amplify the difference between the two voltages.

Yet another embodiment of the present invention comprises a method for instructing a register to hold a predetermined state. This embodiment comprises developing a voltage difference and amplifying the voltage difference, thereby ultimately instructing the register to hold the predetermined state. The method further comprises increasing a power supply voltage, developing the voltage difference between two nodes.

One embodiment of the method of instructing a register to hold a predetermined state comprises generating an output that rises from a first predetermined state (ground for example) to a second predetermined state (the full operating power supply voltage for example). This method may further include generating the output by inputting a sufficient voltage difference into an amplifier which develops sufficient gain thereby instructing a register to hold a predetermined state.

Still another embodiment of the present invention comprises resetting at least a part of an integrated circuit. This method includes applying a power supply voltage (about 3.3, 2.5, 1.8, 1.2 or less volts for example), thereby developing a voltage difference between two nodes in the integrated circuit. The voltage difference is amplified and an output that rises from ground towards the full voltage of the power supply is generated. In this embodiment, generating the output includes inputting a sufficient voltage difference into an amplifier and enabling a sufficient gain by the amplifier to amplify the voltage difference.

These and other advantages and novel features of the present invention, as well as details of an illustrated embodiment thereof, will be more fully understood from the following description and drawings.

DETAILED DESCRIPTION OF THE INVENTION

The following description is made with reference to the appended figures.

Figure 1:
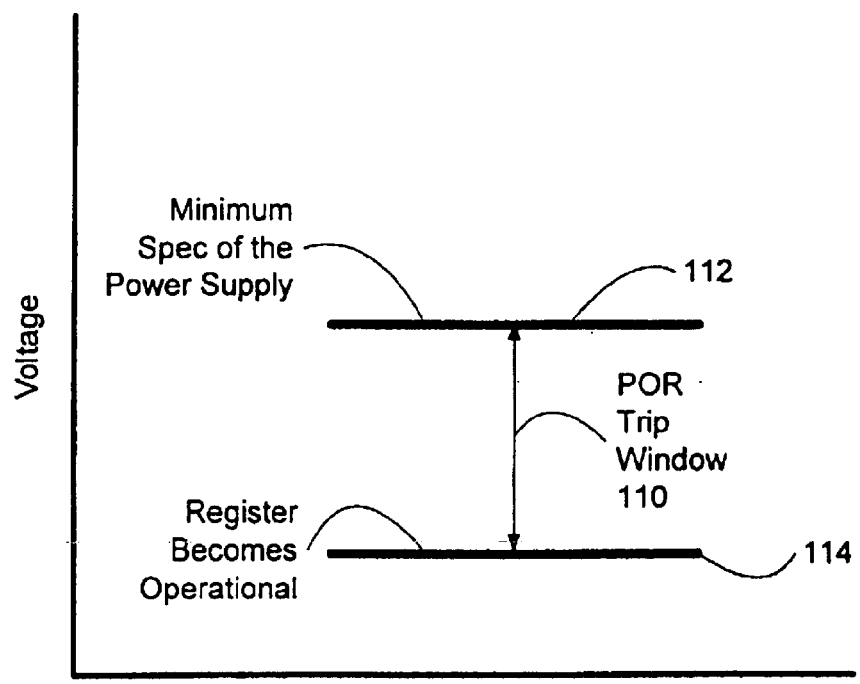
FIG. 1 illustrates a power-on reset trip window in accordance with one embodiment of the present invention.

FIG. 1 illustrates one embodiment of a preferred POR trip window in accordance with the present invention. As illustrated, it is contemplated that the POR trip window 110 is less than the minimum spec or voltage 112 of the power supply but greater than the voltage 114 at which all registers become operational.

In prior art POR circuits, the fundamental method used to detect that a minimum voltage level resides at the power supply pins of the integrated circuit or integrated circuit block, employs the Vt of a PFET transistor as provided previously. However, advancements in integrated circuit technologies have forced reductions in the power supply voltage levels to about 2 volts in order to achieve reliable operating lifetimes for the products delivered to the market.

Unfortunately, the Vt of such known fabrication techniques has not been directly scaled with the power supply reduction associated with each new generation of silicon technology. As a result, the known circuit techniques employed when power supplies were greater are no longer able to adequately provide the level of control necessary at today's power supply levels.

Figure 2:
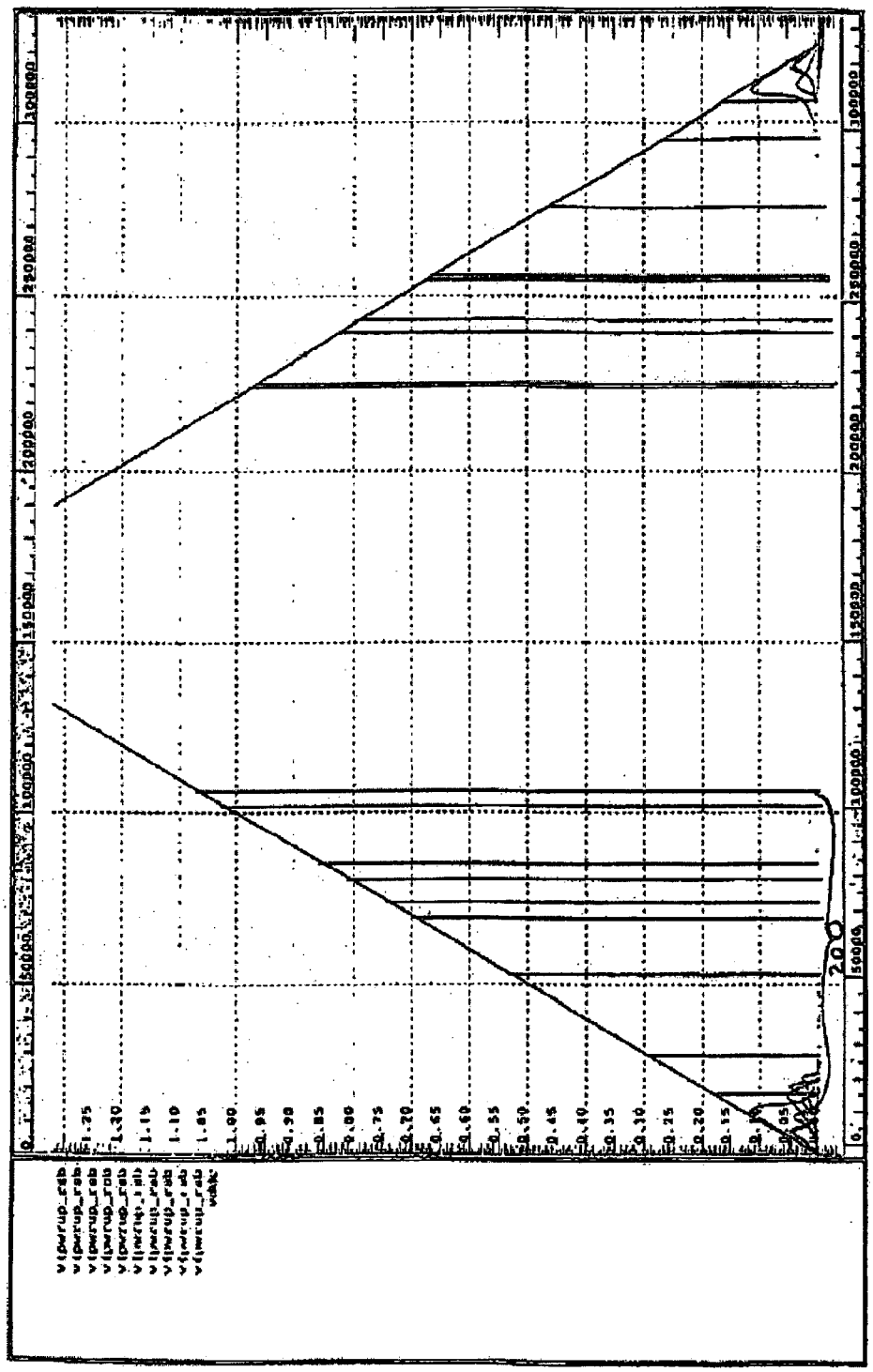
FIG. 2 illustrates voltage waveforms associated with known POR circuit implementations.

FIG. 2 illustrates an example of the voltage waveforms associated with a known POR circuit implementation as a function of power supply. As the integrated circuits operate over various temperature and process corners, the POR "trip" point, where the output voltage changes from a low level to a high level, varies and a relatively wide "trip window", generally designated 200, is observed.

One difference between one embodiment of the present invention and known techniques implementing the POR function is that such embodiment does not specifically depend on the physical parameters of a transistor (i.e., Vt) to realize a solution. Rather, pure circuit techniques are used to improve the operating range, accuracy and robustness of the POR function operating with relatively low power supply voltages (i.e., power supplies having a full operating power supply voltage of about 3.3, 2.5, 1.8, 1.2 or less volts for example). While one or more embodiments of the present invention operate at relatively low power supply voltages (about 3.3, 2.5, 1.8, 1.2 or less volts, it is contemplated that the present invention will work with higher power supply voltages (greater than about 2.0 volts, about 3 to 5 volts for example).

In one embodiment of the present invention, the PFET Vt is eliminated as the power supply "sensing" element. In its place the concept of amplifying a differential voltage is substituted. In other words, an amplifier solution is used as opposed to a device-restricted solution. As the power supply turns on, it develops an increasing voltage, which correspondingly creates two other voltages that increase at different rates. An amplifier then, assuming that it also has enough power supply voltage to operate, amplifies the difference between the varied rate voltage pair. Finally, the POR trip voltage window is tuned such that the point at which the amplifier develops enough gain to amplify the difference between the dual rate voltages is in excess of the power supply voltage required for register operation, but less than the minimum operational voltage supply specification (as illustrated in FIG. 1). It should be appreciated that, while only one register is referred to and discussed, a plurality of registers are also contemplated. Furthermore, while registers are discussed, other circuit structures are also contemplated.

One objective of a power-on reset or POR circuit is to detect when a power supply voltage is being applied to an integrated circuit and when that power supply voltage reaches a certain predetermined level. Once such sufficient voltage level is attained, sufficient being defined for example by the point at which other circuit structures, more specifically register circuits, are able to function properly, the POR produces an electrical signal which tells or instructs the registers to hold a predetermined state (a logic 1 or a logic 0 for example). It is often desirable that a logic system start up in a known state.

Figure 3:
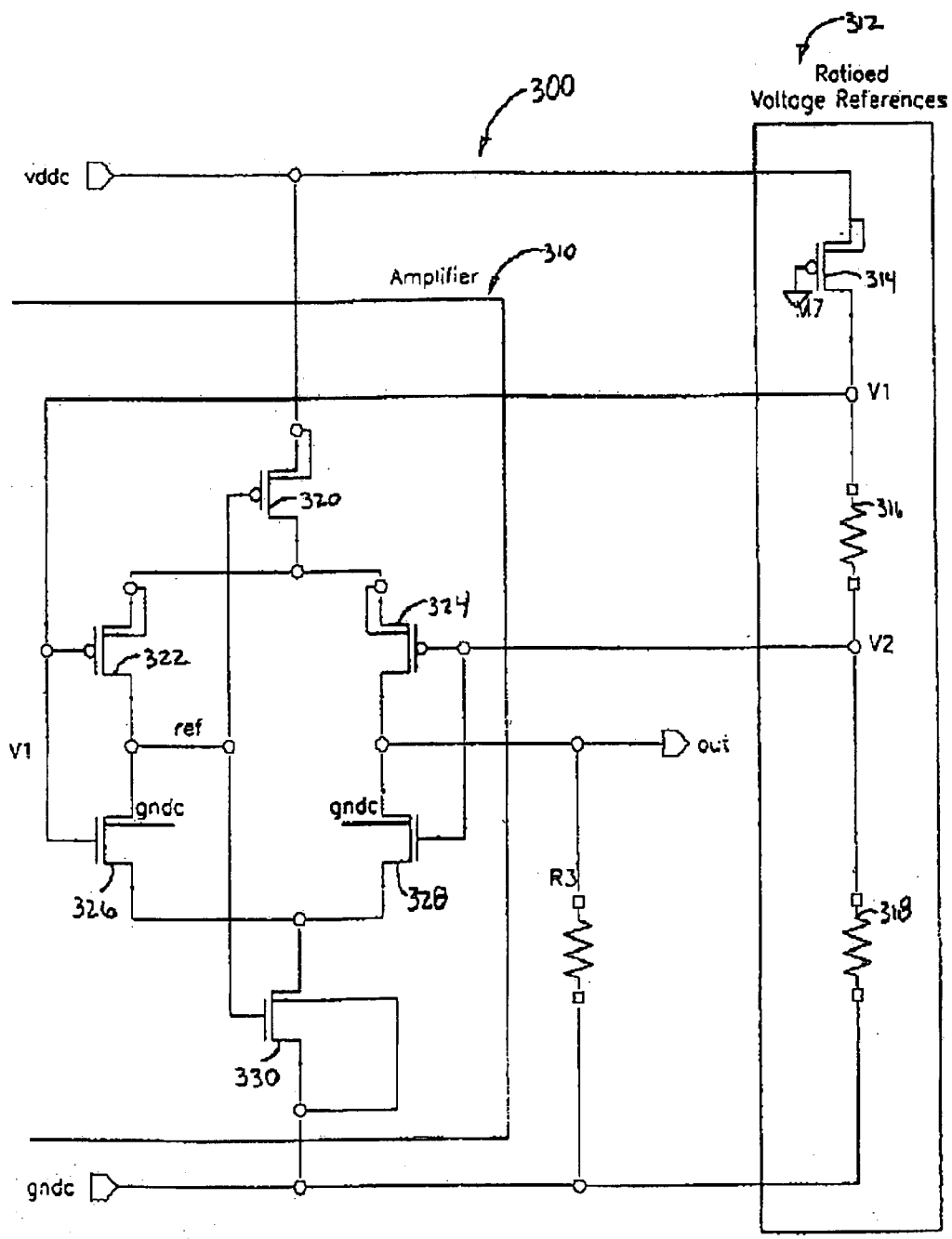
FIG. 3 illustrates a circuit diagram of one embodiment of a power-on reset circuit in accordance with the present invention.

The circuit implementation shown in FIG. 3 illustrates the components and connectivity used to create one embodiment of the basic POR circuit. Additional features that may be added to enhance robustness are discussed later. As described above, this POR implementation 300 consists of an amplifier 310 in conjunction with two voltage references, which change at different ratios as a function of power supply voltage. In other words, as the power supply ramps up, each voltage reference changes or increases at its own rate in response to the power supply voltage change. These dissimilar ratios create a voltage difference between the two references where such voltage difference increases with increased power supply voltage.

In one embodiment, a resistor divider circuit 312 is employed to accomplish the ratioed voltage references. In this embodiment the resistor divider comprises PMOS transistor 314, series resistors 316 and 318 and Intermediate nodes V1 and V2, where V1 and V2 become the ratioed voltage reference signals. In one embodiment, series resistors 316 and 318 have different resistance values, but it is also contemplated that such resistors may have the same value. The ratioed voltage reference signals are fed into the self-referenced amplifier 310 constructed from PMOS devices 320, 322 and 324, and NMOS devices 326, 328 and 330. In the illustrated embodiment, POR implementation 300 may include a resistor R3, and a connection (generally designated ref) connecting at least devices 320, 322, 326 and 330.

Figure 4:
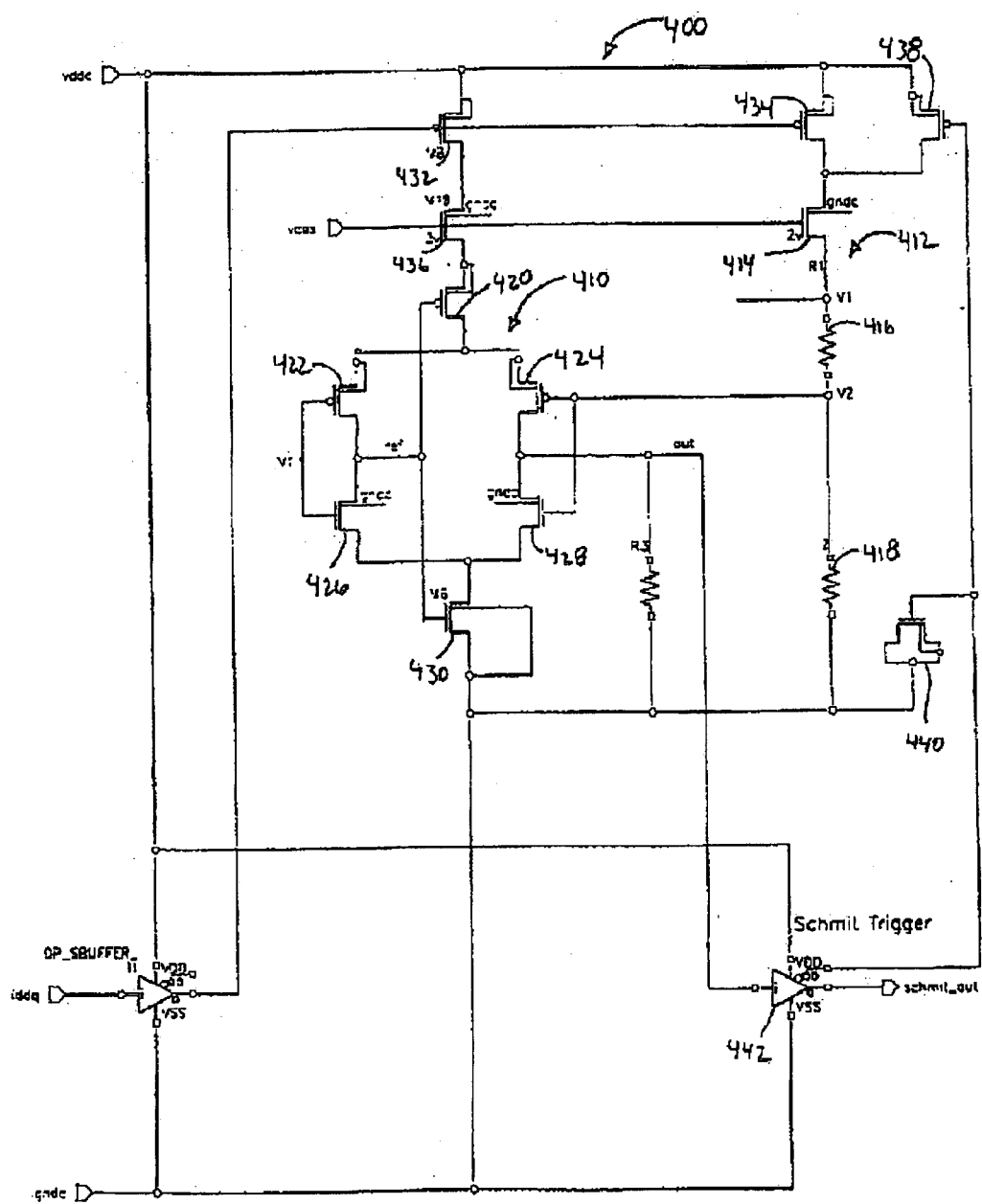
FIG. 4 illustrates a circuit diagram of one embodiment of a power-on reset similar to that illustrated in FIG. 3 including additional components in accordance with the present invention.

Referring to FIG. 4, one embodiment of the present invention, generally designated 400, is illustrated including additional components and circuits incorporated to enhance the feature set and robustness of the POR circuit (similar to the POR circuits provided previously). In this embodiment, circuit 400 includes the amplifier 410, comprising PMOS devices 420, 422, 424 and NMOS devices 426, 428 and 430 (where a connection, designated ref, is illustrated connecting at least devices 420, 422, 426 and 430); and a resistor divider circuit 412, comprising transistor 414, series resistors 416 and 418 and intermediate nodes V1 and V2. In one embodiment, circuit 400 may include resistor R3, transistor device 440, and devices DP Buffer and 442 (a Schmit Trigger for example). An enhanced feature set may include, for example, an lddq switch for zero-current (test mode), dual power supply operation and hysteresis for avoiding problems with power supply voltage glitches. In the illustrated embodiment, PMOS transistors 432 and 434 are switches, which may be used to completely power down the POR circuitry for lddq mode (i.e., a zero-current test mode).

Most integrated circuits today have more than one power supply voltage. Generally two or more power supplies are used. For example, a low voltage power supply may be used to power the digital logic circuits and a higher voltage power supply may be used for the I/O interfaces and/or Analog functions. NMOS transistors 436 and 414 implement such dual power supply POR capability, where these NMOS devices are coupled to a secondary power supply (referred to as vddp in illustrated circuit 400). The dual power supply POR feature guarantees that both power supplies are in their intended ranges of operation before the POR trip signal is switched, assuring proper voltage is applied to all circuits and operation of the integrated circuit does not commence prematurely.

Finally, the hysteresis function is used to prevent false re-triggering of the POR in the presence of moderate-size power supply glitches. In this embodiment, such a hysteresis function is implemented using a PMOS transistor 438.

Figure 5:
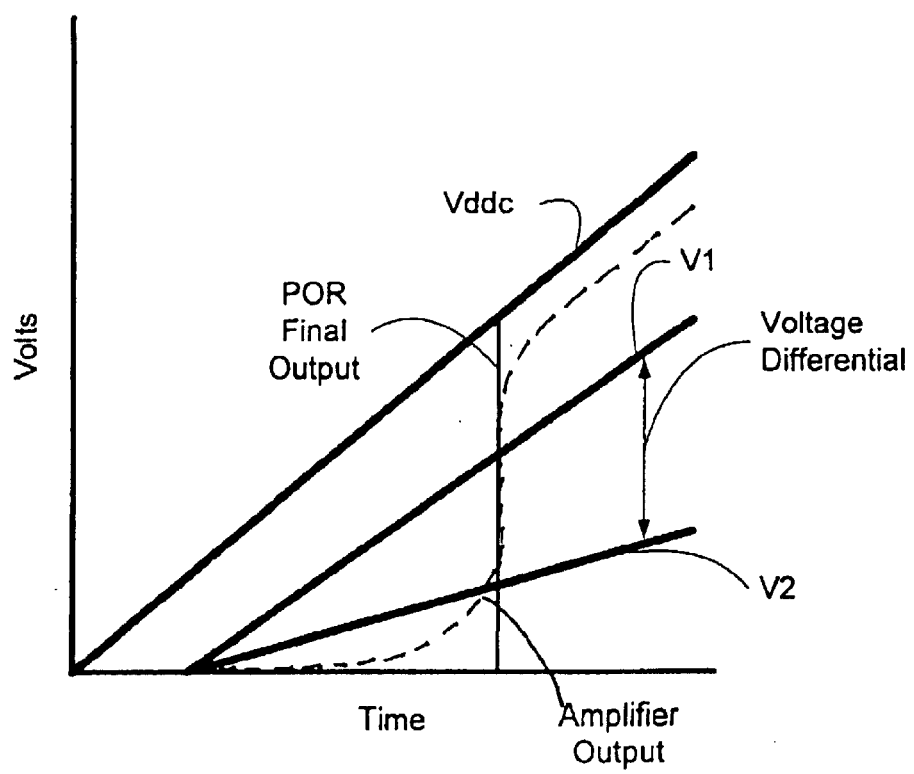
FIG. 5 illustrates the voltage differential and output associated with one embodiment of a power-on reset circuit similar to that illustrated in FIG. 4 in accordance with the present invention.

FIG. 5 illustrates the operation of one embodiment of the POR circuit in accordance with the present invention and operates as follows. The power supply voltage, represented by signal vddc, starts at about zero volts relative to ground (alternatively referred to as gndc in the schematic drawings). All nodes in the POR are at zero volts relative to ground. Further, the output or signal "out" is also at ground. As a power supply applied to node vddc starts to ramp up or increase in voltage, nodes V1 and V2 eventually begin to rise, though at different voltage rates. Once enough power supply voltage has been developed, a voltage difference is created between nodes V1 and V2.

At some point or period of time after the power supply voltage starts to ramp up (and continuing during such ramp up) the amplifier begins to function. At the point when there is a combination of enough voltage differential into the amplifier and the amplifier has sufficient gain, the amplifier output (i.e., signal "out", represented in FIG. 5 by a dashed line) responds by rising from ground towards the full operating power supply voltage. A second stage amplifier (a Schmit trigger for example illustrated in FIG. 4) may amplify this output further. Successive amplifications (See FIG. 6) may cause the transfer curve of the POR switch point (represented as POR Final Output, FIG. 5) to sharpen dramatically.

Figure 6:
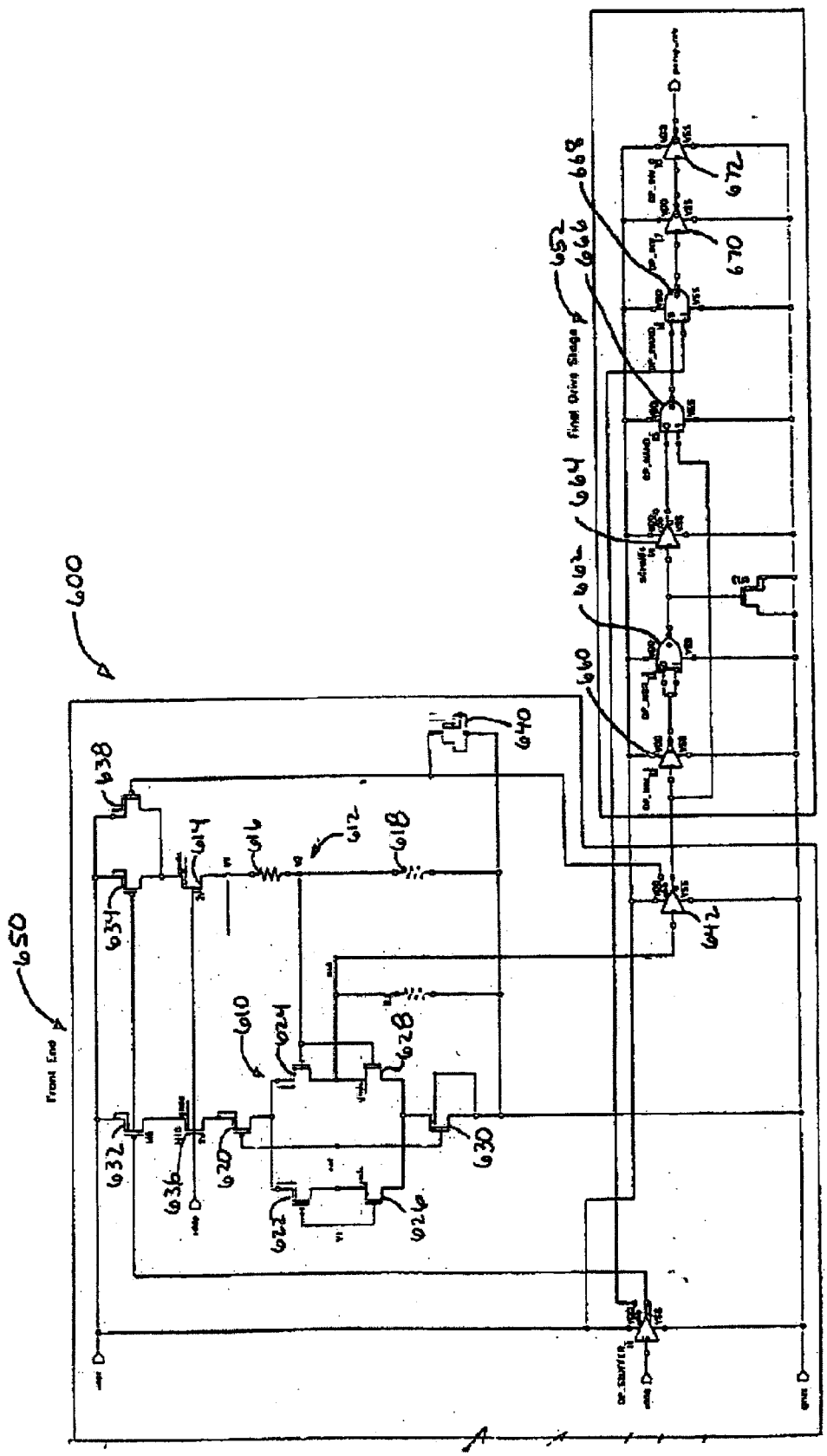
FIG. 6 illustrates a circuit diagram of one embodiment of an integrated circuit including both a front end portion (including a power-on reset circuit similar to that illustrated in FIG. 4) and final drive stage in accordance with the present invention.

FIG. 6 illustrates a circuit diagram of one embodiment of a POR generally designated 600 consisting of two functional blocks, the Front End portion 650 and the Final Drive Stage 652. In the illustrated embodiment, the Front End portion 650 includes the amplifier 610, comprising PMOS devices 620, 622, 624 and NMOS devices 626, 628 and 630 (where a connection, designated ref, is illustrated connecting at least devices 620, 622, 626 and 630); and a resistor divider circuit 612, comprising transistor 614, series resistors 616 and 618 and intermediate nodes V1 and V2. In one embodiment the front end may include resistor R3. As illustrated, the Front End portion also includes the optional enhanced features similar to those provided previously, including the lddq switch implemented using PMOS transistors 632 and 634; the dual power supply function implemented using NMOS transistors 636 and 614 (and may include vddp); and the hysteresis function implemented using a PMOS transistor 638.

The Final Drive Stage 652 includes a plurality of circuit devices or elements having a plurality of functions. In the illustrated embodiment, the Final Drive Stage includes inverters 660, 664, 670 and 672; NAND gates 666 and 668; and a NOR gate 662. The Final Drive Stage is common to both the present invention and the prior art.

Figure 7:
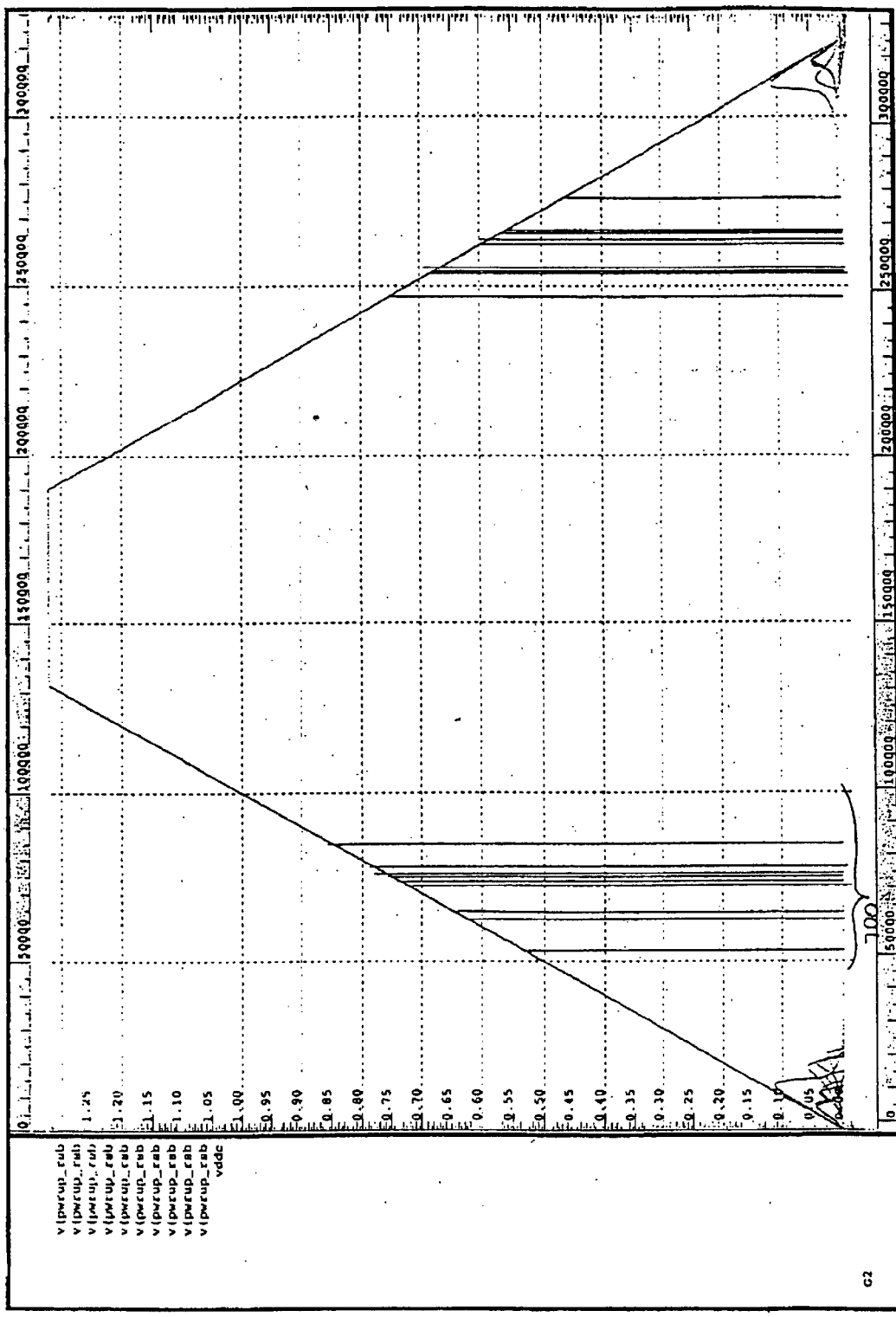
FIG. 7 illustrates voltage waveforms associated with one embodiment of an integrated circuit similar to that illustrated in FIG. 6 in accordance with the present invention.

FIG. 7 illustrates the voltage waveforms associated with the circuit of FIG. 6 as a function of power supply. As integrated circuits operate over various temperature and process corners, the POR "trip" point, where the output voltage changes from a low level to a high level, varies and a "trip window" generally designated 700 is observed. The present invention contains or constrains the voltage width of this window 700 better than prior art POR implementations (trip window 200 of FIG. 2) at the power supply voltage levels available on nanometer semiconductor technology.

Figure 8:
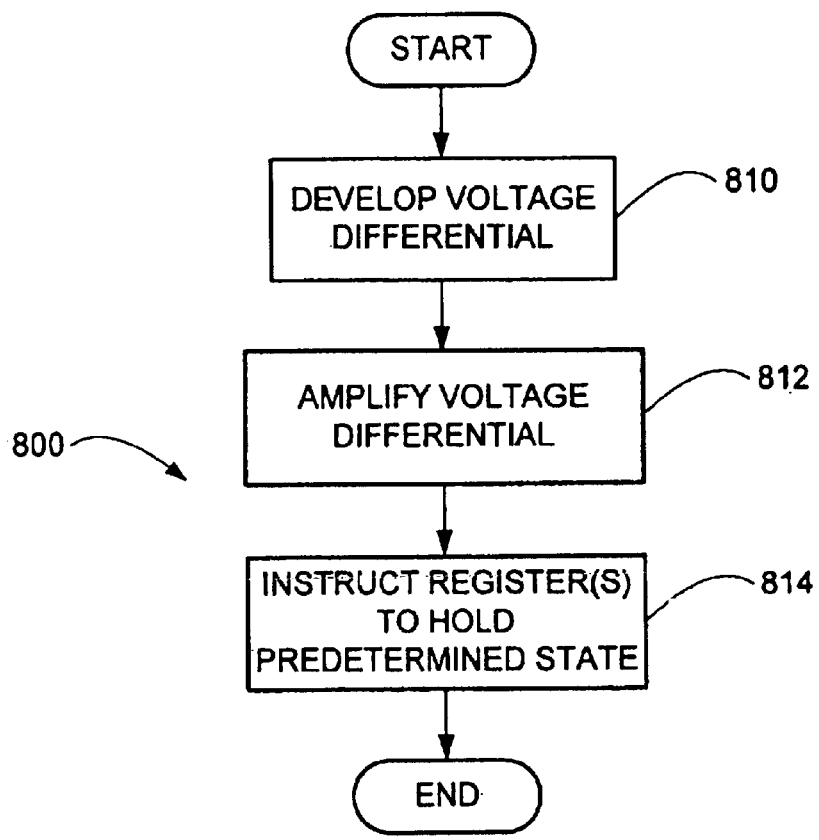
FIG. 8 illustrates a high level flow diagram depicting one method of instructing a register to hold a predetermined state.

FIG. 8 illustrates a high level flow diagram depicting one method, generally designated 800, of instructing a register(s) to hold a predetermined state (i.e., presetting the register(s)).

In this embodiment, the method 800 comprises developing a voltage differential as illustrated by block 810. The voltage differential is amplified as illustrated by block 812. The register(s) are instructed to hold a predetermined state using the amplified voltage differential as illustrated by block 814.

Figure 9:
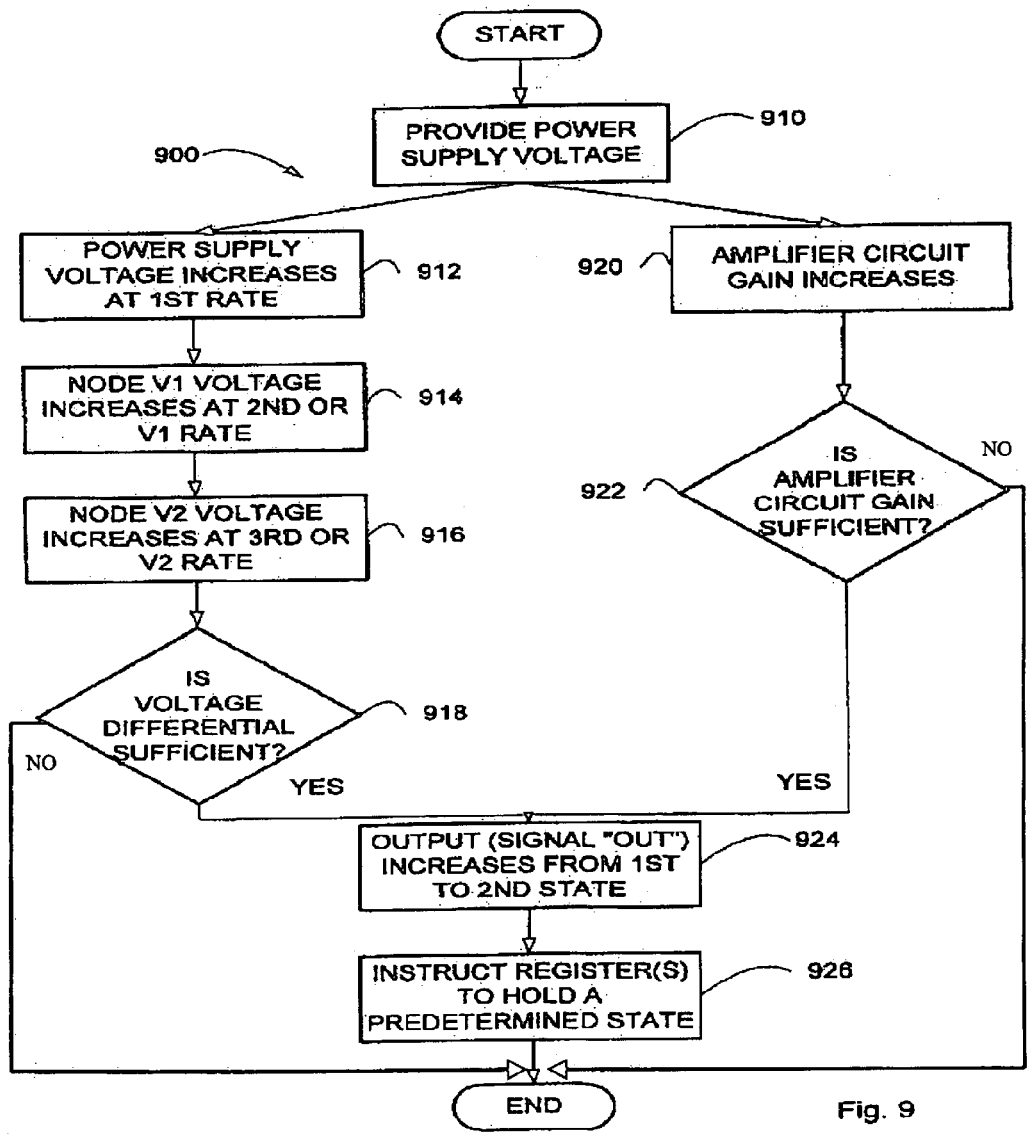
FIG. 9 illustrates a detailed flow diagram depicting one method of instructing a register to hold a predetermined state.

FIG. 9 illustrates a detailed flow diagram depicting one method, generally designated 900, of instructing a register(s) to hold a predetermined state (i.e., presetting the register(s)). This embodiment of the method includes providing a power supply voltage as illustrated by block 910. The supply voltage is increased as illustrated by block 912. In this embodiment, the power supply voltage increased at a predetermined first rate until it reaches the full operating power supply voltage (less than about 2.0 volts for example).

The node voltage V1 rises or increases at a predetermined second or V1 rate as illustrated by block 914, while the node voltage V2 rises or increases at a predetermined third or V2 rate as illustrated by block 916. It is contemplated that the predetermined second rate may equal the predetermined first rate, but the predetermined second and third rates will not equal each other. This difference between the predetermined second and third rates creates a voltage differential as provided previously. The present invention determines if the voltage differential between nodes V1 and V2 is sufficient as illustrated by diamond 918.

The gain of the amplifier of the present invention increases as illustrated by block 920. The present invention determines if the amplifier gain is sufficient as illustrated by diamond 922. Only when the combination of the voltage differential between nodes V1 and V2 is sufficient AND the amplifier gain is sufficient does the output signal (signal "out") increase from a first to a second predetermined state. In one embodiment of the present invention, the output signal increases from ground to the full operating power supply voltage as illustrated by block 924. The register(s) are then instructed to hold a predetermined state (i.e., the registers are preset) as illustrated by block 926.

It is contemplated that the POR and the method of instructing registers in accordance with aspects of the present invention provides/includes one or more of the following advantages and features: (1) reduces, tightens or otherwise improves the trip window for technologies which operate at low power supply levels; (2) provides the identical set of features (i.e., Iddq test mode, dual supply capability and hysteresis) as the prior art implementation(s); (3) scales into future technologies as the present invention does not depend on critical or specific device parametrics; (4) able to fit into existing layout footprint without area penalty; and (5) reuses the Final drive Stage circuitry, reducing time to market and increasing likelihood of first pass success.

Many modifications and variations of the present invention are possible in light of the above teachings. Thus, it is to be understood that, within the scope of the appended claims, the invention may be practiced otherwise than as described hereinabove.

What is claimed is:

1. A reset circuit comprising:

a differential voltage generation circuit adapted to create two voltages changing at different rates forming a voltage difference, wherein said voltage difference increases with an increase in power supply voltage;

an amplifier circuit having at least one Schmidt trigger adapted to amplify a difference between said two voltages, thereby instructing a register to hold a predetermined state; and a switch comprising two PMOS devices adapted to power down the reset circuit for testing.

2. The circuit of claim 1, wherein said differential voltage generation circuit produces a varied rate voltage pair.

3. The circuit of claim 1, wherein said differential voltage generation circuit comprises a resistor divider circuit.

4. The circuit of claim 3, wherein said resistor divider circuit comprises at least one transistor.

5. The circuit of claim 4, wherein said at least one transistor comprises at least one PMOS device.

6. The circuit of claim 3, wherein said resistor divider circuit comprises two series resistors.

7. The circuit of claim 6, wherein said two series resistors have different resistance values.

8. The circuit of claim 1, wherein said amplifier circuit comprises at least one PMOS device.

9. The circuit of claim 1, wherein said amplifier circuit comprises at least one NMOS device.

10. The circuit of claim 1 further comprising at least two transistor devices coupled to at least one of said differential voltage generation and amplifier circuits, wherein said transistor devices are adapted to be used with a secondary power supply.

11. The circuit of claim 1, further comprising a hysteresis element adapted to prevent false re-triggering of the reset circuit.

12. The circuit of claim 11, wherein said hysteresis element comprises a PMOS transistor.

13. The circuit of claim 1, wherein said amplifier circuit comprises a first amplifier circuit and a second amplifier circuit comprising at least said Schmidt trigger, said second amplifier circuit coupled to at least said first amplifier circuit.

14. The circuit of claim 13, wherein said second amplifier circuit comprising at least said Schmidt trigger is adapted to amplify an output of said first amplifier circuit.

15. The circuit of claim 1, wherein the circuit is adapted to be used with primary and secondary power supplies.

16. The circuit of claim 15, wherein said primary power supply comprises a low voltage power supply.

17. The circuit of claim 15, wherein said secondary power supply comprises a high voltage power supply.

18. The circuit of claim 1, wherein said amplifier circuit comprises at least a self-referenced amplifier.

* * * * *